United States Patent
Zhang et al.

(10) Patent No.: US 10,199,538 B2
(45) Date of Patent: Feb. 5, 2019

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Jie Zhang, Xiamen (CN); Jianming Liu, Xiamen (CN); Xueliang Zhu, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/853,913

(22) Filed: Dec. 25, 2017

(65) Prior Publication Data
US 2018/0138364 A1  May 17, 2018

Related U.S. Application Data

(63) Continuation of application No. PCT/CN2016/097871, filed on Sep. 2, 2016.

(30) Foreign Application Priority Data

Dec. 14, 2015 (CN) .......................... 2015 1 0921693

(51) Int. Cl.
*H01L 33/14* (2010.01)
*H01L 33/00* (2010.01)
(Continued)

(52) U.S. Cl.
CPC ............ *H01L 33/14* (2013.01); *H01L 27/156* (2013.01); *H01L 33/00* (2013.01); *H01L 33/0075* (2013.01); *H01L 33/02* (2013.01); *H01L 33/06* (2013.01); *H01L 33/12* (2013.01); *H01L 33/145* (2013.01); *H01L 33/32* (2013.01);
(Continued)

(58) Field of Classification Search
CPC ..... H01L 33/14; H01L 33/0075; H01L 33/46; H01L 33/38; H01L 33/145; H01L 27/156; H01L 33/32; H01L 33/06; H01L 33/12; H01L 33/00; H01L 33/02
See application file for complete search history.

(56) References Cited

U.S. PATENT DOCUMENTS

2015/0255675 A1  9/2015 Song et al.

FOREIGN PATENT DOCUMENTS

| CN | 102064262 A | 5/2011 |
| CN | 102136537 A | 7/2011 |

*Primary Examiner* — William Coleman
(74) *Attorney, Agent, or Firm* — Syncoda LLC; Feng Ma; Junjie Feng

(57) ABSTRACT

A light-emitting diode includes a conductive mask layer planted over a substrate surface. An epitaxial laminated layer is formed over the conductive mask layer via epitaxial growth; and a current channel is formed over the epitaxial laminated layer; during injection, current is firstly conducted to the conductive mask layer through the current channel, and then to the epitaxial laminated layer after horizontal spreading over the conductive mask layer, which effectively improves current spreading uniformity and reduces working voltage of device. Meanwhile, the conductive mask layer reflects light to further improve extraction efficiency and light-emitting luminance.

20 Claims, 4 Drawing Sheets

(51) Int. Cl.
*H01L 33/02* (2010.01)
*H01L 33/12* (2010.01)
*H01L 27/15* (2006.01)
*H01L 33/06* (2010.01)
*H01L 33/32* (2010.01)
*H01L 33/38* (2010.01)
*H01L 33/46* (2010.01)

(52) U.S. Cl.
CPC .............. *H01L 33/38* (2013.01); *H01L 33/46* (2013.01); *H01L 2933/0016* (2013.01); *H01L 2933/0025* (2013.01)

LIGHT EMITTING DIODE AND FABRICATION METHOD THEREOF

CROSS-REFERENCE TO RELATED APPLICATIONS

The present application is a continuation of, and claims priority to, PCT/CN2016/097871 filed on Sep. 2, 2016, which claims priority to Chinese Patent Application No. 201510921693.2 filed on Dec. 14, 2015. The disclosures of these applications are hereby incorporated by reference in their entirety.

BACKGROUND

GaN-based light-emitting diodes are widely applied due to energy saving and environmental protection. However, the LED chip is prone to current blockage due to poor current spreading capacity, which may cause voltage rise and efficiency loss, in particular in such high-current and high-luminance applications as road lighting, mine lighting or other high-intensity application fields.

SUMMARY

The inventors of the present disclosure have recognized problems in existing technologies. For example, a nitride light-emitting diode can have a buffer layer, an n-type semiconductor layer, an active layer, a p-type semiconductor layer, and a p-type contact layer over a sapphire substrate via epitaxial growth; and a p-electrode and an n-electrode formed over the p-type contact layer and the n-type nitride semiconductor layer. In this LED structure, as electrons would deviate to near path during movement from the n-electrode to the p-electrode, the p-type semiconductor layer and the n-type semiconductor layer are of serious current blockage effect, which may cause voltage rise and efficiency decease due to local over-high current density.

At present, in the p-type layer, current spreading is improved with a metal spreading finger in combination with ITO, GZO and other transparent conducting layers; however, in the n-type part, current spreading uniformity is only improved by spreading finger technology. However, to add n-type spreading fingers, ICP or other methods are required to remove the p-type semiconductor layer and the active layer till the n-type semiconductor layer, which narrows light-emitting area of the chip and causes loss of luminance. In particular, for large-power conventional LED chip with large single chip area, current blockage effect is more significant, requiring 2 pieces or more n-type spreading fingers, resulting in higher loss of luminance and lower photoelectric efficiency.

To solve these problems, in one aspect of the present disclosure, a light-emitting diode with a current spreading structure is provided, wherein, a conductive mask layer is planted over the substrate surface. An epitaxial laminated layer is formed over the conductive mask layer via epitaxial growth; and a current channel (or path) is formed over the epitaxial laminated layer; during injection, current is firstly conducted to the conductive mask layer through the current channel, and then to the epitaxial laminated layer after horizontal spreading over the conductive mask layer, which effectively improves current spreading uniformity and reduces working voltage of device.

Some embodiments of the present disclosure provide a light-emitting diode, which includes an insulating substrate having an upper surface and a lower surface opposite to each other; a conductive mask layer over the upper surface of the insulating substrate, with exposed patterns that expose part of the upper surface of the substrate; an epitaxial laminated layer over the conductive mask layer via epitaxial growth, comprising a first-type semiconductor layer, an active layer and a second-type semiconductor layer from bottom to up; a current channel over the epitaxial laminated layer, which passes through the first-type semiconductor layer and connects to the conductive mask layer; when current is injected to the epitaxial laminated layer, most electron current is conducted to the conductive mask layer through the current channel, and then flows to the epitaxial laminated layer after horizontal spreading over the conductive mask layer.

In a second aspect of the present disclosure, a fabrication method of the light-emitting diode is provided, which includes 1) providing an insulating substrate having an upper surface and a lower surface opposite to each other; 2) fabricating a conductive mask layer over the upper surface of the insulating substrate, with exposed patterns that expose part of the upper surface of the substrate; 3) depositing an epitaxial laminated layer over the conductive mask layer, including a first-type semiconductor layer, an active layer and a second-type semiconductor layer from bottom to up; 4) fabricating a current channel over the epitaxial laminated layer, which passes through the first-type semiconductor layer and connects to the conductive mask layer; when current is injected to the epitaxial laminated layer, most electron current is conducted to the conductive mask layer through the current channel, and then flows to the epitaxial laminated layer after horizontal spreading over the conductive mask layer.

In some embodiments, the exposed patterns of the conductive mask layer are in regular arrangement with sizes of 0.1-5 μm.

In some embodiments, the conductive mask layer can reflect light emitted by the active layer.

In some embodiments, the conductive mask layer is made of conductive metal material, preferably with good conductivity and high reflectivity.

In some embodiments, the conductive mask layer is horizontally mixed with a conductive metal material layer and a dielectric material layer.

In some embodiments, the conductive mask layer is provided with an insulating protective layer.

In a preferred embodiment of the present disclosure, the epitaxial laminated layer comprises a first electrode region and a light-emitting region; the current channel includes a first current channel and a second current channel, wherein, the first current channel is in the first electrode region, and the second current channel is in the light-emitting region; a first electrode is arranged over the surface of the first-type semiconductor layer, which is electrically connected to the conductive mask layer through the first current channel; a second electrode is over the surface of the second-type semiconductor layer; the conductive mask layer is electrically connected to the first-type semiconductor layer through the second current channel; when current is injected to the first and the second electrodes, as conductivity of the conductive mask layer is much higher than that of nitride material, most electrode current is conducted to the conductive mask layer through the first current channel, and flows to the first-type semiconductor layer along the second current channel after horizontal spreading over the conductive mask layer.

In some embodiments, the second current channel passes through the first-type semiconductor layer, the active layer and the second-type semiconductor layer, and forms ohmic contact with the first-type semiconductor layer and is insulated from the active layer and the second-type semiconductor layer. In some embodiments, the portion of the second current channel over the active layer and the second-type semiconductor layer serves as the light conduction channel. In some embodiments, the portion of the second current channel over the insulating layer and the first-type semiconductor layer is filled with conductive material, and the portion over the active layer and second-type semiconductor layer is filled with transparent insulating material.

In another preferred embodiment of the present disclosure, the epitaxial laminated layer comprises a first electrode region and a light-emitting region, wherein, the current channel is in the first electrode region; a first electrode is over the first-type semiconductor layer surface, which is electrically connected to the conductive mask layer through the current channel; a second electrode is over the surface of the second-type semiconductor layer; when current is injected into the first and the second electrodes, as conductivity of the conductive mask layer is much higher than that of nitride material, most electrode current is conducted to the conductive mask layer through the current channel, and flows to the first-type semiconductor layer, the active layer and the second-type semiconductor layer after horizontal spreading over the conductive mask layer.

In a third aspect of the present disclosure, a light-emitting system comprising a plurality of light-emitting diodes is provided. Each light-emitting diode further comprises a current spreading structure, wherein, a conductive mask layer is planted over the substrate surface. An epitaxial laminated layer is formed over the conductive mask layer via epitaxial growth; and a current channel is formed over the epitaxial laminated layer; during injection, current is firstly conducted to the conductive mask layer through the current channel, and then to the epitaxial laminated layer after horizontal spreading over the conductive mask layer, which effectively improves current spreading uniformity and reduces working voltage of device. The light-emitting system can be used in the fields of lighting, display, signage, etc.

Other features and advantages of various embodiments this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

DETAILED DESCRIPTION

The embodiments of the present disclosure will be described in detail with reference to the accompanying figures and preferred embodiments.

Figure 1:
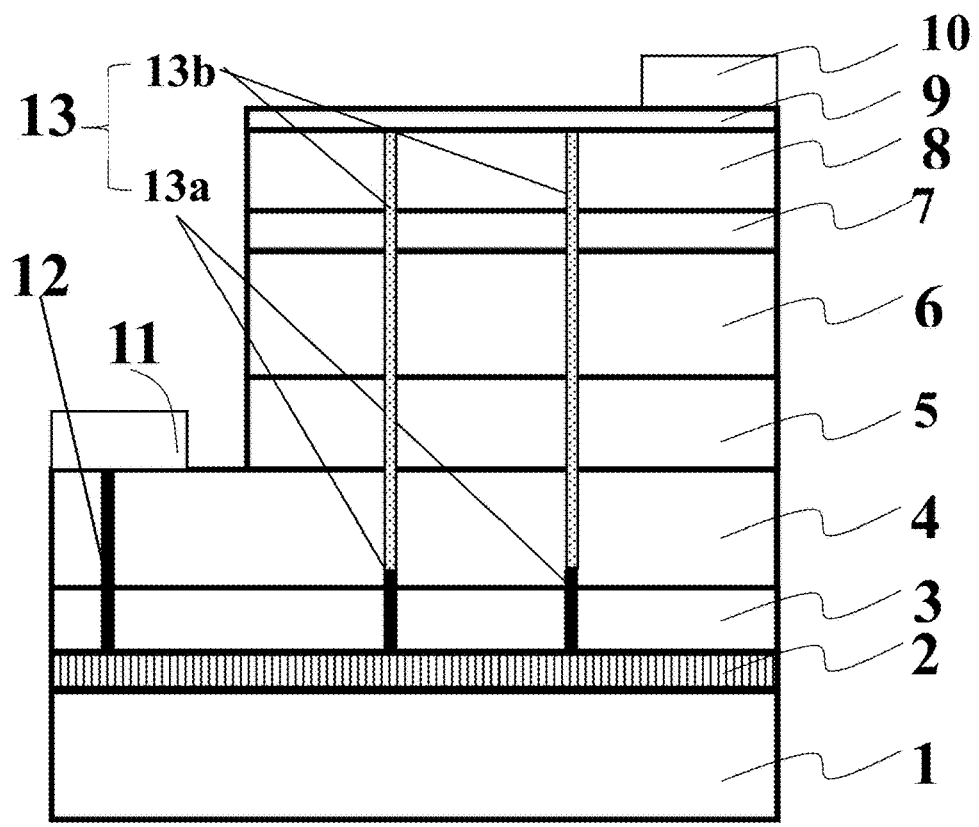
FIG. 1 illustrates a sectional view of a light-emitting diode provided in some embodiments of the present disclosure.

With reference to FIG. 1, a light-emitting diode according to some embodiments of the present disclosure includes an insulating substrate 1, a conductive mask layer 2, an u-type nitride layer 3, an n-type nitride layer 4, an n-type super-lattice structure layer 5, an active layer 6, a p-type electronic blockage layer 7, a p-type nitride layer 8, a current spreading layer 9, a p-electrode 10, an n-electrode 11, a first current channel 12 and a second current channel 13, wherein, the n-electrode 11 is electrically connected to the conductive mask layer 2 through the first current channel 12, and the conductive mask layer 2 is electrically connected to the n-type nitride layer via the second current channel 13.

The insulating substrate 1 can be sapphire, AlN, GaN and other materials, and the surface structure can be a plane structure or a patterned structure.

Figure 2:
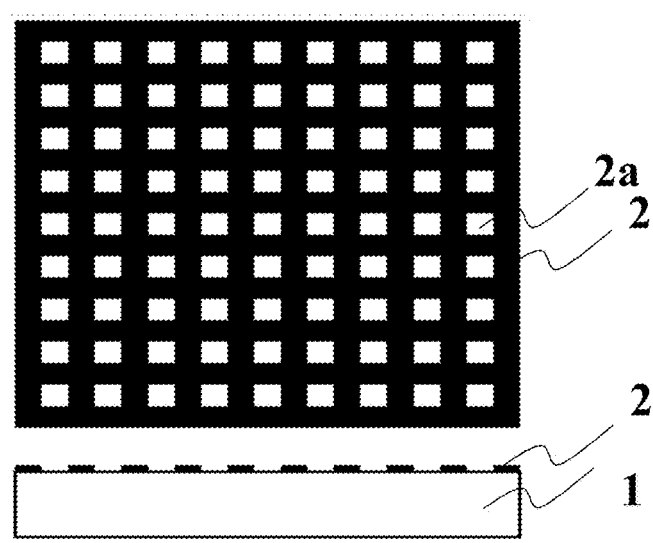
FIG. 2 shows a pattern applied to the conductive mask layer 2 over a plane substrate surface of the present disclosure.
Figure 3:
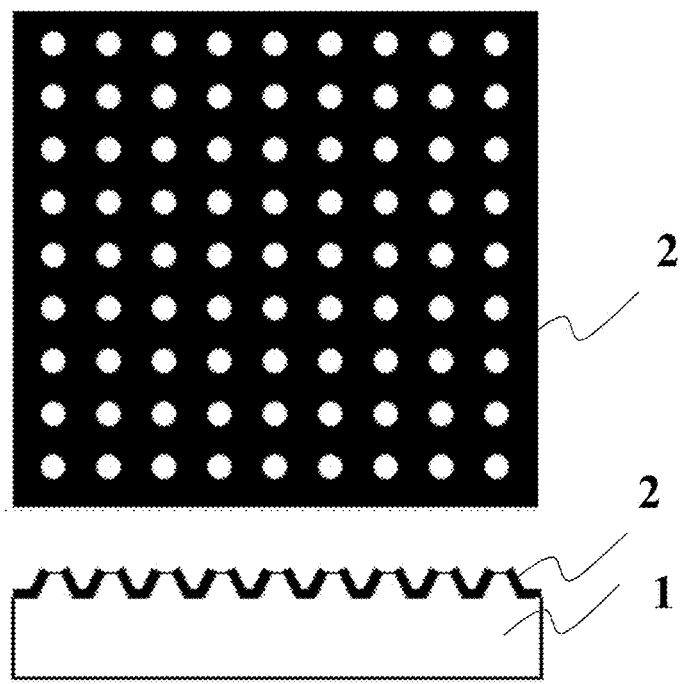
FIG. 3 shows another pattern applied to the conductive mask layer 2 over a patterned substrate surface of the present disclosure.
Figure 4:
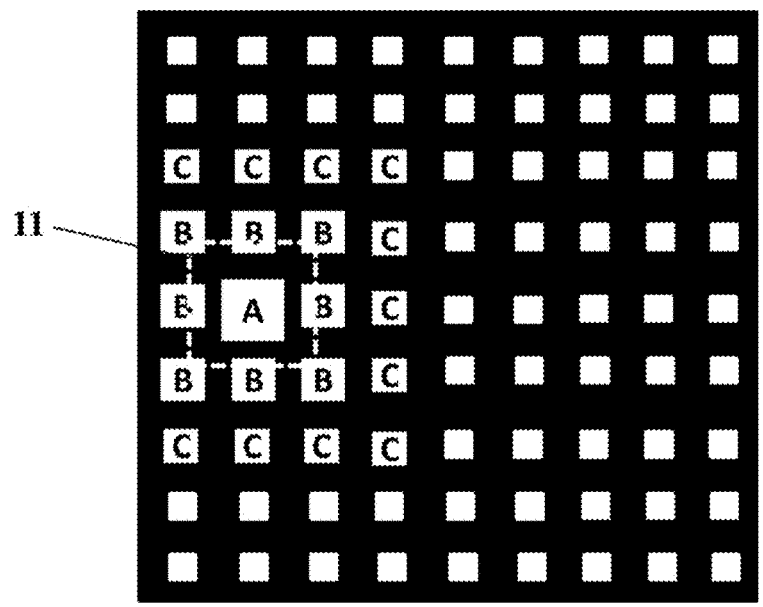
FIG. 4 shows another pattern applied to the conductive mask layer 2 of the present disclosure.
Figure 5:
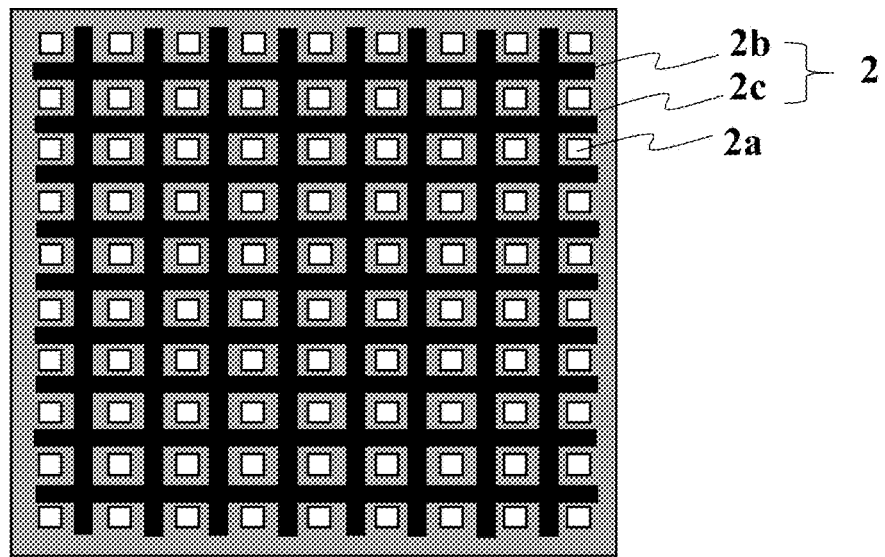
FIG. 5 shows another pattern applied to the conductive mask layer 2 of the present disclosure.

The conductive mask layer 2 is over the upper surface of the insulating substrate 1, with exposed patterns 2a (see, e.g., FIG. 2) that expose the upper surface of the insulating substrate 1. In some embodiments, the exposed patterns of the conductive mask layer 2 have sizes of 0.1-5 μm with regular and uniform arrangement, which can be square, circular or other patterns. As shown in FIGS. 2 and 3, the conductive mask layer 2 is black, and the exposed patterns of the conductive mask layer 2 are white. In FIG. 2, the conductive mask layer 2 is over a plane substrate surface, and in FIG. 3, the conductive mask layer 2 is over a patterned substrate surface. In some embodiments, the exposed patterns of the conductive mask layer 2 are not arranged uniformly, wherein, the exposed pattern close to the n-electrode 11 is large, and the one far from the n-electrode 11 is small. The exposed patterns are uniformly arranged after a certain distance. As shown in FIG. 4, the exposed pattern A is right below the n-electrode 11, with largest size, and the exposed patterns B and C get smaller gradually with increasing distance to the n-electrode 11, which are of same size and density beyond the exposed pattern C. In some embodiments, the conductive mask layer 2 prefers to be conductive metal material with good conductive performance and high reflectivity, such as Al, Ag and Au. In some embodiments, the conductive mask layer 2 is composed of a latticed conductive metal material layer, for example, as shown in FIGS. 2 and 3; in other embodiments, the conductive mask layer 2 is horizontally mixed by a conductive metal material layer 2b and a dielectric layer 2c (such as: Au/SiN, Au/SiO$_2$ and other composite layers), as shown in FIG. 5, wherein, branches of the conductive metal material layer 2b are connected to each other.

An unintentionally doped nitride layer 3 (u-type nitride layer 3 for short), an n-type nitride layer 4, an n-type super-lattice structure layer 5, an active layer 6, a p-type electronic blocking layer 7 and a p-type nitride layer 8 constitute an epitaxial laminated layer, which is formed over the surface of the conductive mask layer. Specifically, the u-type nitride layer 3 is formed over the surface of the conductive mask layer 2, which generally comprises a 20-50 nm low-temperature buffer layer, a 1-2 μm 3D nitride layer and a 1-2 μm 2D nitride layer. The n-type nitride layer 4 is formed over the u-type nitride layer 3 with thickness of 1.5-4

μm and doping concentration of 5E18 cm$^{-3}$-2E19 cm$^{-3}$. The n-type super-lattice structure layer 5 is formed over the surface of the n-type nitride layer 4, which can be a carbon nitride or nitride multi-layer structure with II, III or IV group elements, such as InGaN/GaN, AlGaN/GaN, InGaN/GaN/ AlGaN or AlGaN/GaN/InGaN. An active layer 6 is formed over the surface of the n-type super-lattice layer 5, which can be a multiple-quantum well structure, wherein, the InGaN layer is the well layer and the GaN layer is the barrier layer, in which, film thickness of the well layer is 18 Å-30 Å, and film thickness of the barrier layer is 80 Å-200 Å. A 10-30 nm electronic blocking layer 7 is formed over the surface of the active layer 6, which can be composed of a Mg-doped AlInGaN layer. A 50-150 nm p-type nitride layer 8 is formed over the surface of the active layer 6. The epitaxial laminated layer comprises an n-electrode region and a light-emitting region, wherein, the n-electrode region is etched to remove the n-type super-lattice structure layer 5, the active layer 6, the p-type electronic blocking layer 7 and the p-type nitride layer 8, and to expose the surface of the n-type nitride layer 4.

With reference to FIG. 1, the first current channel 12 is in the n-electrode region of the epitaxial laminated layer, and passes through the n-type nitride layer 4 and the buffer layer 3 to connect to the conductive mask layer 2; the second current channel 13 is in the light-emitting region of the epitaxial laminated layer and passes through all layers of the epitaxial laminated layer. The fabrication method of the first and second current channels includes: forming micro through-holes in the epitaxial laminated layer through chemical etching or dry etching; then, filling conductive materials under the micro through-holes 13a till the n-type nitride layer 4 to guarantee ohmic contact between the first current channel 12 and the conductive mask layer 2. Meanwhile, the second current channel 13 forms ohmic contact with the conductive mask layer 2 and the n-type nitride layer 4. In some embodiments, insulating materials can be filled above the micro through-holes 13b to insulate the second current channel 13 from the active layer 6, the electronic blocking layer 7 and the p-type nitride layer 8. In some embodiments, ions can be injected to achieve high resistance of the side wall of the micro through-holes 13b above the n-type nitride layer 4, and are insulated from the active layer 6, the electronic blocking layer 7 and the p-type nitride layer 8 when reaching the second current channel 13. Similarly, light emitted from the active layer 6 can pass through upwards through the micro through-holes 13b, which effectively eliminates light absorption effect of the epitaxial material layer.

The current spreading layer 9 is over the surface of the p-type nitride layer 8, which can be a conventional transparent metal oxide (such as ITO). The p-electrode 10 is over the surface of the current spreading layer 9, wherein a spreading finger can be provided. The n-electrode 11 is arranged over the surface of the n-type nitride layer 4 that exposes the n-electrode region.

In the above light-emitting diode structure, when current is injected to the p-electrode and n-electrode, as metal conductive performance is much higher than that of the n-type nitride (such as n-GaN material), most electron current is conducted to the conductive mask layer 2 through the first current channel 12, and then flows to the n-type nitride layer 4 through the second current channel 13, after horizontal spreading over the conductive mask layer 2, which effectively improves current spreading uniformity and reduces working voltage of device. Meanwhile, the conductive mask layer reflects light to further improve chip extraction efficiency and light-emitting luminance.

The aforesaid light-emitting diode can be fabricated by the method below. First, fabricate a conductive mask layer 2 over the upper surface of the substrate 1, wherein, the pattern of the conductive mask layer can be selected with reference to FIGS. 2-5; then, grow an epitaxial laminated layer including a u-type nitride layer 3, an n-type nitride layer 4, an n-type super-lattice structure layer 5, an active layer 6, a p-type electrode blocking layer 7 and a p-type nitride layer 8 via epitaxial growth over the substrate with a conductive mask layer; next, define an n-electrode region and a light-emitting region over the formed epitaxial laminated layer surface; fabricate a first and a second current channel with reference to the fabrication method aforesaid; next, etch and remove the n-type super-lattice structure layer 5, the active layer 6, the p-type electrode blocking layer 7 and the p-type nitride layer 8 in the n electrode region to expose the surface of the n-type nitride layer 4 and to form an n-electrode mesa; next, fabricate a transparent conducting layer 9 over the surface of the p-type nitride layer; and finally, fabricate a p-electrode and an n-electrode. In this method, on the one hand, the conductive mask layer 2 serves as the mask layer for epitaxial growth, so as to get an epitaxial laminated layer with high lattice quality over the epitaxial layer through lateral growth; on the other hand, the conductive mask layer serves as a current spreading layer and a reflective layer, which can effectively improve light-emitting efficiency of the device.

Figure 6:
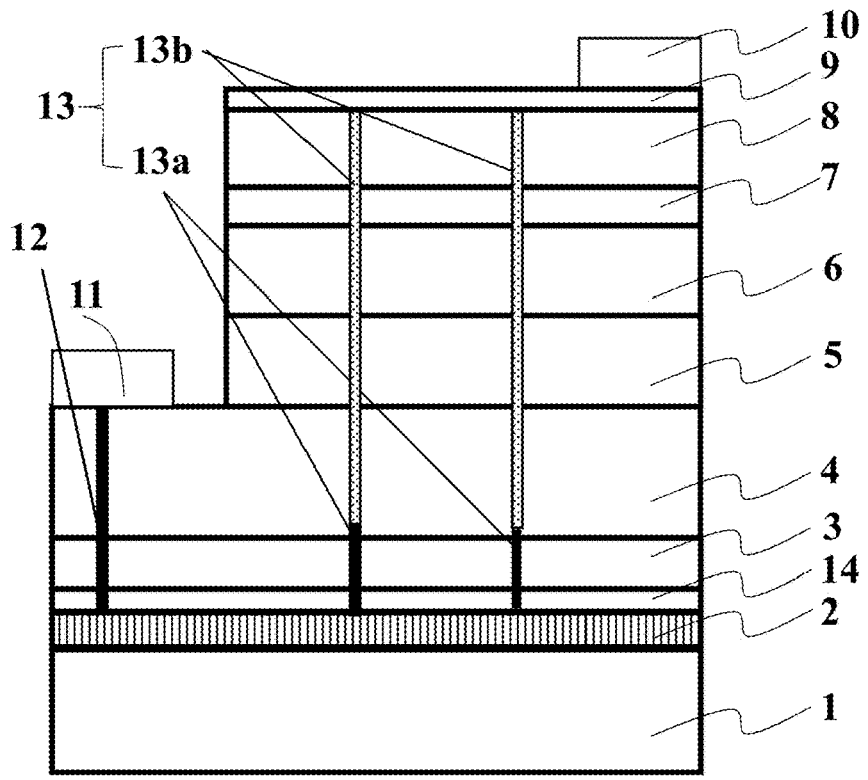
FIG. 6 illustrates a sectional view of another light-emitting diode provided in some embodiments of the present disclosure.

FIG. 6 shows another embodiment of a light-emitting diode in the present disclosure, and the difference of this embodiment from the light-emitting diode shown in FIG. 1 is that: fabricate an insulating protective layer 14 over the conductive mask layer 2, which can be SiO$_2$. The insulating protective layer 14 has the same pattern as that of the conductive mask layer 2.

Figure 7:
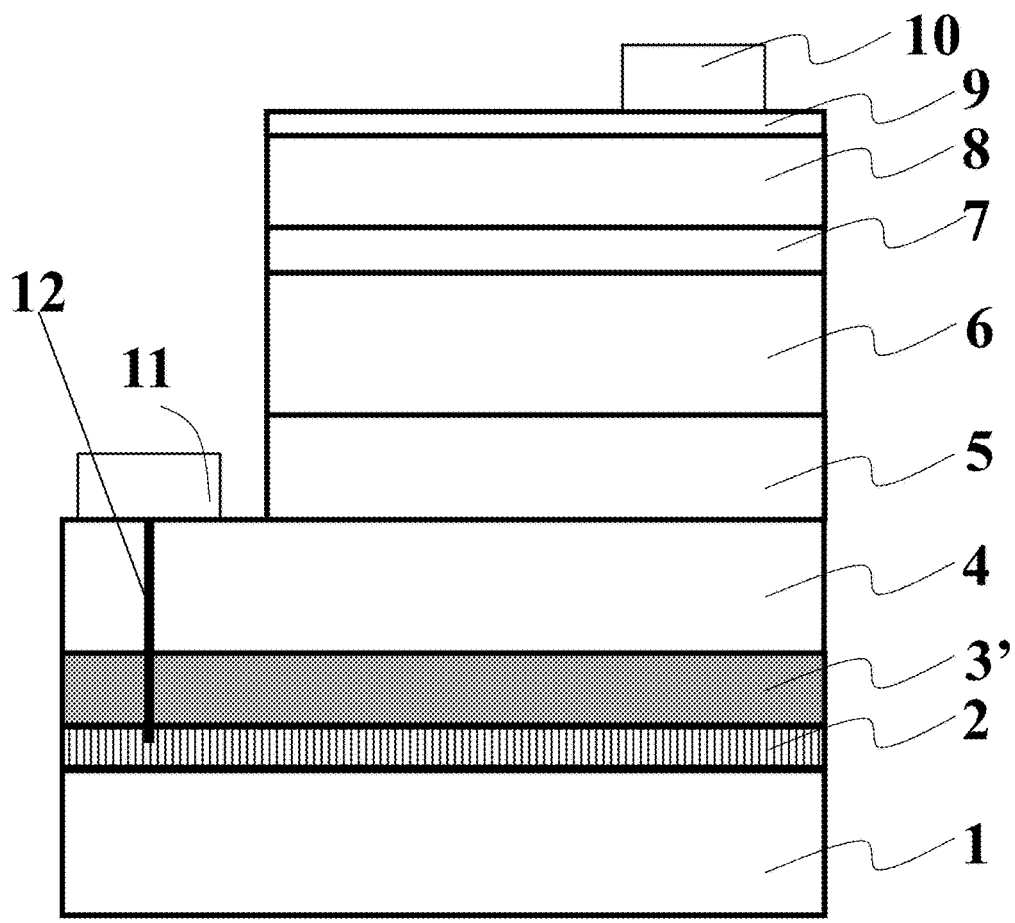
FIG. 7 illustrates a sectional view of another light-emitting diode provided in some embodiments of the present disclosure.

With reference to FIG. 7, another embodiment of a light-emitting diode in the present disclosure includes: an insulating substrate 1, a conductive mask layer 2, an n-type doping buffer layer 3', an n-type nitride layer 4, an n-type super-lattice structure layer 5, an active layer 6, a p-type electronic blockage layer 7, a p-type nitride layer 8, a current spreading layer 9, a p-electrode 10, an n-electrode 11 and a first current channel 12, wherein, the first current channel 12 of the n-electrode 11 is electrically connected to the conductive mask layer 2.

In this light-emitting diode, the buffer layer is conductive n-type doping nitride with doping concentration above 5E18 cm$^{-3}$; when current is injected into the p-electrode and n-electrode, as metal conductivity is much higher than that of the n-type nitride layer (such as n-GaN material), most electrode current is conducted to the conductive mask layer 2 through the first current channel, and flows to the n-type doping buffer layer 3 and the n-type nitride layer 4 after horizontal spreading over the conductive mask layer. In this light-emitting diode, the conductive mask layer 2 prefers to be designed with the pattern shown in FIG. 4.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
   an insulating substrate having an upper surface and a lower surface opposite to each other;
   a conductive mask layer over the upper surface of the insulating substrate, with exposed patterns that expose part of the upper surface of the substrate;
   an epitaxial laminated layer over the conductive mask layer via epitaxial growth, comprising a first-type semiconductor layer, an active layer and a second-type semiconductor layer from bottom to up; and
   a current channel over the epitaxial laminated layer, which passes through the first-type semiconductor layer and connects to the conductive mask layer;
   wherein if current is injected to the epitaxial laminated layer, most electron current is conducted to the conductive mask layer through the current channel, and then flows to the epitaxial laminated layer after horizontal spreading over the conductive mask layer; and
   wherein the current channel includes a first current channel in the first electrode region, and a second current channel in the light-emitting region.

2. The light-emitting diode of claim 1, wherein the exposed patterns of the conductive mask layer are in regular arrangement.

3. The light-emitting diode of claim 1, further comprising a u-type nitride layer between the conductive mask layer and the first-type semiconductor layer, wherein the conductive mask layer is configured to reflect light emitted by the active layer.

4. The light-emitting diode of claim 1, wherein the conductive mask layer is made of a conductive metal material.

5. The light-emitting diode of claim 1, wherein the conductive mask layer is horizontally arranged by a conductive metal material layer and a dielectric material layer.

6. The light-emitting diode of claim 1, wherein:
   the epitaxial laminated layer comprises a first electrode region and a light-emitting region;
   a first electrode is arranged over the surface of the first-type semiconductor layer, which is electrically connected to the conductive mask layer through the first current channel;
   a second electrode is over the surface of the second-type semiconductor layer;
   the conductive mask layer is electrically connected to the first-type semiconductor layer through the second current channel; and
   if current is injected to the first and the second electrodes, most electrode current is conducted to the conductive mask layer through the first current channel, and flows to the first-type semiconductor layer along the second current channel after horizontal spreading over the conductive mask layer.

7. The light-emitting diode of claim 1, wherein:
   the epitaxial laminated layer comprises a first electrode region and a light-emitting region, wherein, the current channel is in the first electrode region;
   a first electrode is arranged over the surface of the first-type semiconductor layer, which is electrically connected to the conductive mask layer through the current channel;
   a second electrode is over the surface of the second-type semiconductor layer;
   if current is injected to the first and the second electrodes, most electrode current is conducted to the conductive mask layer through the current channel, and flows to the first-type semiconductor layer, the active layer and the second-type semiconductor layer after horizontal spreading over the conductive mask layer.

8. The light-emitting diode of claim 1, wherein the conductive mask layer is provided with an insulating protective layer.

9. The light-emitting diode of claim 2, wherein the exposed patterns of the conductive mask layer have sizes of 0.1-5 µm.

10. The light-emitting diode of claim 6, wherein the second current channel passes through the first-type semiconductor layer, the active layer and the second-type semiconductor layer, and forms ohmic contact with the first-type semiconductor layer and is insulated from the active layer and the second-type semiconductor layer.

11. The light-emitting diode of claim 10, wherein the portion of the second current channel over the active layer and the second-type semiconductor layer serves as the light conduction channel.

12. A fabrication method of a light-emitting diode, method the comprising:
   1) providing an insulating substrate having an upper surface and a lower surface opposite to each other;
   2) fabricating a conductive mask layer over the upper surface of the insulating substrate, with exposed patterns that expose part of the upper surface of the substrate;
   3) depositing an epitaxial laminated layer over the conductive mask layer, comprising a first-type semiconductor layer, an active layer and a second-type semiconductor layer from bottom to up;
   4) fabricating a current channel over the epitaxial laminated layer, which passes through the first-type semiconductor layer and connects to the conductive mask layer;
   wherein if a current is injected to the epitaxial laminated layer, most electron current is conducted to the conductive mask layer through the current channel, and then flows to the epitaxial laminated layer after horizontal spreading over the conductive mask layer; and
   wherein the current channel includes a first current channel in the first electrode region, and a second current channel in the light-emitting region.

13. The fabrication method of claim 12, further comprising forming a u-type nitride layer between the conductive mask layer and the first-type semiconductor layer, wherein:
   in step 4), the epitaxial laminated layer comprises a first electrode region and a light-emitting region; and
   the current channel is in the first electrode region.

14. The fabrication method of claim 12, wherein:
   in step 4), the epitaxial laminated layer comprises a first electrode region and a light-emitting region;
   a first electrode is fabricated over the surface of the first-type semiconductor layer, which is electrically connected to the conductive mask layer through the first current channel;
   a second electrode is fabricated over the surface of the second-type semiconductor layer;
   the conductive mask layer is electrically connected to the first-type semiconductor layer through the second channel; and
   if current is injected to the first and the second electrodes, most electrode current is conducted to the conductive mask layer through the first current channel, and flows to the first-type semiconductor layer along the second current channel after horizontal spreading over the conductive mask layer.

15. A light-emitting system comprising a plurality of light-emitting diodes, each light-emitting diode including:
- an insulating substrate having an upper surface and a lower surface opposite to each other;
- a conductive mask layer over the upper surface of the insulating substrate, with exposed patterns that expose part of the upper surface of the substrate;
- an epitaxial laminated layer over the conductive mask layer via epitaxial growth, comprising a first-type semiconductor layer, an active layer and a second-type semiconductor layer from bottom to up; and
- a current channel over the epitaxial laminated layer, which passes through the first-type semiconductor layer and connects to the conductive mask layer; and
- wherein if a current is injected to the epitaxial laminated layer, most electron current is conducted to the conductive mask layer through the current channel, and then flows to the epitaxial laminated layer after horizontal spreading over the conductive mask layer; and wherein the current channel includes a first current channel in the first electrode region, and a second current channel in the light-emitting region.

16. The light-emitting system of claim 15, wherein the exposed patterns of the conductive mask layer are in regular arrangement.

17. The light-emitting system of claim 15, wherein the conductive mask layer can reflect light emitted by the active layer.

18. The light-emitting system of claim 15, each light-emitting diode further comprising a u-type nitride layer between the conductive mask layer and the first-type semiconductor layer, wherein the conductive mask layer is made of a conductive metal material.

19. The light-emitting system of claim 15, wherein the conductive mask layer is horizontally arranged by a conductive metal material layer and a dielectric material layer.

20. The light-emitting system of claim 16, wherein the exposed patterns of the conductive mask layer are 0.1-5 μm.

* * * * *